United States Patent [19]
Razeghi

[11] Patent Number: 5,668,395
[45] Date of Patent: Sep. 16, 1997

[54] COMPOSITION FOR INSB AND GAAS THIN FILM ON SILICON SUBSTRATE FOR USE IN PHOTODETECTORS

[75] Inventor: Manijeh Razeghi, Wilmette, Ill.

[73] Assignee: Northwestern University, Evanston, Ill.

[21] Appl. No.: 680,277

[22] Filed: Jul. 11, 1996

Related U.S. Application Data

[63] Continuation of Ser. No. 344,340, Nov. 22, 1994, abandoned.

[51] Int. Cl.$^6$ .................................................. H01L 31/00
[52] U.S. Cl. ........................................... 257/441; 257/458
[58] Field of Search ................................. 257/441, 189, 257/458

[56] References Cited

U.S. PATENT DOCUMENTS

| | | | |
|---|---|---|---|
| 3,364,084 | 1/1968 | Reubrwein . | |
| 4,207,122 | 6/1980 | Goodman . | |
| 4,368,098 | 1/1983 | Manasevit . | |
| 4,404,265 | 9/1983 | Manasevit . | |
| 4,720,309 | 1/1988 | Deveaud et al. . | |
| 4,793,872 | 12/1988 | Meunier et al. . | |
| 4,874,438 | 10/1989 | Oshita et al. . | |
| 4,897,149 | 1/1990 | Suzuki et al. . | |
| 4,902,356 | 2/1990 | Noguchi et al. . | |
| 4,952,811 | 8/1990 | Elliott . | |
| 5,232,869 | 8/1993 | Frigo et al. . | |
| 5,252,142 | 10/1993 | Matsuyama et al. | 257/458 |
| 5,304,824 | 4/1994 | Tonai | 257/183 |

FOREIGN PATENT DOCUMENTS 55-27657  2/1980  Japan .

OTHER PUBLICATIONS

Wickenden et al., *Growth of Epitaxial Layers of Gallium Nitride on Silicon Carbine and Corundum Substrates*, Journal of Crystal Growth 9, pp. 158–164 (1971).

Sugiyama et al., *Vapor Phase Epitaxial Growth and Characterization of $Ga_{1-z}In_yAs_{1-x}P_x$ Quarterly Alloys*, Japanese Journal of Applied Physics, pp. 2197–2203 (Dec., 1977).

Holmes & Kamath, *Growth Characteristics of LPE InSb and InGaSb*, Journal of Electronic Materials, vol. 9, pp. 95–111, (Nov. 1, 1980).

Noreika, Francombe & Wood, *Growth of Sb and InSb by Molecular–Beam Epitaxy*, Journal of Applied Physics 52(12), pp. 7416–7420, (Dec., 1981).

Wood, Noreika & Francombe, *Thallium Incorporation in Molecular–Beam–Epitaxial InSb*, J.Appl.Phys. 59(10), pp. 3610–3612 (May, 1986).

Williams et al., *Molecular–Beam Epitaxy of (100) InSb for CdTe/InSb Device Applications*, J.Appl.Phys. 63(5), pp. 1526–1532 (Mar. 1, 1988).

Kurtz et al., *High Photoconductive Gain in Lateral InAsSb strained–Layer Superlattice Infrared Detectors*, Appl. Phys. Lett. 53(20), pp. 1960–1963 (Nov. 14, 1988).

Chyi et al., *Growth of InSb and $InAs_{1-x}Sb_x$ on GaAs By Molecular Beam Epitaxy*, Appl.Phys.Lett. 53(12), pp. 1092–1094 (Sep. 19, 1988).

Williams et al., *Heteroepitaxial Growth of InSb on (100) GaAs Using Molecular Beam Epitaxy*, Appl.Phys.Lett. 53(13), pp. 1189–1191 (Sep. 26, 1988).

Chyi et al., *Growth of InSb and $InAs_{1-x}Sb_x$ on GaAs By Molecular Beam Epitaxy*, Appl.Phys.Lett. 53(12), pp. 1092–1094 (Sep. 19, 1988).

Razeghi, *A Survey of GaInAsP–InP for Photonic and Electronic Applications*, vol. 1, The MOCVD Challenge, Chapters 1,4 & 5 (1989).

Akasaki et al., *Effects of Ain Buffer Layer on Crystallographic Structure and on Electrical and Optical Properties of GaN and $Ga_{1-x}Al_xN$ Films Grown on Sapphire Substrate by Movpe*, Journal of Crystal Growth 98, pp. 209–219 (1989).

Chyi et al., *Molecular Beam Epitaxial Growth and Characterization of InSb on Si*, Appl.Phys.Lett. 54(11), pp. 1016–1018 (Mar. 13, 1989).

Davis & Thompson, *Molecular Beam Epitaxy Growth of InSb Films on GaAs*, Appl. Phys. Lett. 54(22), pp. 2235–2237 (May 29, 1989.

Oh et al., *Molecular Beam Epitaxial Growth of High–Quality InSb on InP and GaAs Substrates*, J. Appl. Phys. 66(8), pp. 3618–3621 (Oct. 15, 1989).

Ma et al., *Organometallic Vapor Phase Epitaxial Growth and Characterization of InAsSbBi*, Appl. Phys. Lett. 55 (23), pp. 2420–2422 (Dec. 4, 1989).

Zhang et al., *A Transmission Electron Microscopy and Reflection High–Energy Electron Diffraction Study of the Initial Stages of the Heteroepitaxial Growth of InSb on GaAs (001) by Molecular Beam Epitaxy*, J. Appl. Phys. 67(2), pp. 800–806 (Jan. 15, 1990).

Oliveira et al., *A Generalized Model for the Reconstruction of (001) Surfaces of III–V Compound Semiconductors Based on a Rheed Study of InSb(001)*, Surface Science 227, pp. 150–156 (1990).

(List continued on next page.)

Primary Examiner—Jerome Jackson
Assistant Examiner—Nathan K. Kelley
Attorney, Agent, or Firm—Welsh & Katz, Ltd.

[57] ABSTRACT

An intermetallic compound semiconductor thin film comprises thin film made of either InSb or GaAs heterostructure on a silicon substrate. Preferably, the thin film is grown by a Molecular Beam Epitaxy method.

6 Claims, 1 Drawing Sheet

OTHER PUBLICATIONS

Chow et al., *Growth and Characterization of InAs/Ga$_{1-x}$In$^x$Sb Strained-Layer Superlattices*, Appl. Phys. Lett. 56(15), pp. 1418–1420 (Apr. 9, 1990).

Razeghi et al., *Ga$^{0.51}$In$^{0.49}$P/Ga$^x$In$^{1-x}$As Lattice-Matched (x=0.85) and Strained (x=0.85) Two-Dimensional Electron Gas Field-Effect Transistors*, Semicond. Sci. Technol. 6, pp. 103–107 (1991).

Biefeld & Hebner, *Growth of InSb on GaAs by Metalorganic Chemical Vapor Deposition*, Journal of Crystal Growth 109, pp. 272–278 (1991).

Gaskill et al., *High Mobility InSb Grown By Organometallic Vapor Phase Epitaxy*, Appl. Phys. Lett. 58(17), pp. 1905–1907 (Apr. 29, 1991).

Thompson et al., *Use of Atomic Layer Epitaxy Buffer for The Growth of InSb on GaAs by Molecular Beam Epitaxy*, J. Appl. Phys. 69(10), pp. 7166–7172 (May 15, 1991).

Garbuzov et al., *High-Power 0.8 m InGaAsP-GaAs SCH SQW Lasers*, IEEE Journal of Quantum Electronics, vol. 27. No. 6 (Jun. 6, 1991).

Edgar, J.H., *Prospects for Device Implementation of Wide Band Gap Semiconductors*, J. Mater. Res., vol. 7, No. 1, pp. 235–252 (Jan. 1, 1992).

Chen et al., *Accurate Determination of Misfit Strain, Layer Thickness, and Critical Layer Thickness in Ultrathin Buried Strained InGaAs/GaAs Layer by X-Ray Diffraction*, J.Vac.Sci.Techno. B 10(2), pp. 769–770 (Mar./Apr. 1992).

Soderstrom et al., *Molecular Beam Epitaxy Growth and Characterization of InSb Layers on GaAs Substrates*, Semicond. Sci. Techno. 7, pp. 337–343 (1992).

Kuo et al., *Gas Source Molecular-Beam Epitaxial Growth of Normal Incidence GaAs/AlGaAs Quantum Well Infrared Photodetectors*, J. Vac. Sci. Techno. B 10(2), pp. 995–997 (Mar./Apr. 1992).

Ferguson et al., *RHEED Intensity Effects During the Growth of InAs, InSb and In(As, Sb) By Molecular Beam Epitaxy*, Journal of Crystal Growth 121, pp. 267–277 (1992).

Strite & Morkoc, *aN, AlN, and InN: A Review*, J. Vac. Sci Techno. B 10(4), pp. 1237–1248 (Jul./Aug. 1992).

Chung & Gershenzon, *The Influence of Oxygen on the Electrical and Optical Properties of GaN Crystals Grown By Metalorganic Vapor Phase Epitaxy*, J. Appl. Phys. 72(2), pp. 651–659 (Jul. 15, 1992).

Levine et al., *Photoexcited Escape Probability, Optical Gain, and Noise in Quantum Well Infrared Photodetectors*, J. Appl. Phys. 72 (9), pp. 4429–4443 (Nov. 1, 1992).

Lee et al., *Characterization of Molecular Beam Epitaxially Grown InSb Layers and Diode Structures*, Solid-State Electronics vol. 36, No. 3, pp. 387–389 (1993).

Li et al., *Molecular-Beam Epitaxial Growth of InSb on GaAs and Si for Infrared Detector Applications*, J. Vac. Sci. Techno. 11(3), pp. 872–874 (May/Jun. 1993).

Choi et al., *High Quality InSb Growth on GaAs and Si By Low Pressure Metalorganic Chemical Vapor Deposition*, Mat. Res. Soc. Syrup. Proc. vol. 281, pp. 375–380 (1993).

Schifgaarde et al., *InTlSb: An Infrared Detector Material?*, Appl. Phys. Lett. 62(16), pp. 1857–1859 (Apr. 19, 1993).

Besikci et al., *Anomalous Hall Effect in InSb Layers Grown By Metal Organic Chemical Vapor Deposition on GaAs Substrates*, J.Appl. Phys. 73 (10), pp. 5009–5013 (May 15, 1993).

Choi et al., *Growth of In$^{1-x}$Tl$^x$Sb, a New Infrared Material, By Low-Pressure Metalorganic Chemical Vapor Deposition*, Appl. Phys. Lett. 63 (3), pp. 361–363 (Jul. 19, 1993).

Razeghi et al., *In$^{1-x}$Tl$^x$Sb for Long Wavelength Infrared Photodetectors (Invited Talk)*, Electrochemical Society, Inc. 184 Meeting Program, 3 pages (Oct. 10–15, 1993).

Partin et al., *Growth of High Mobility InSb by Metalorganic Chemical Vapor Deposition*, Journal of Electronic Materials, vol. 23, No. 2 (Jun. 11, 1993).

Staveteig et al., *Photoconductance Measurements on InTlSb/InSb/GaAs Grown By Low-Pressure Metalorganic Chemical Vapor Deposition*, pp. 460–462 (Jan. 24, 1994).

Choi et al., *Charterization of InTlSb/InSb Grown by Low--Pressure Metal-Organic Chemical Vapor Deposition On a GaAs Substrate*, J.Appl. Phys. 75 (6), vol. 75, No. 6 (Mar. 15, 1994).

Diaz et al., *Efficiency of Photoluminescence and Excess Carrier Confinement in InGaAsP/GaAs Structures Prepared By Metal-Organic Chemical-Vapor Deposition*, J. Appl. Phys. 76(2), pp. 700–704 (Jul. 15, 1994).

Cengiz et al., *Electron Transport Properties of Ga0.51In0.4P for Device Applications*, IEEE Transaction on Electron Devices, vol. 4, No. 6, pp. 1066–1069 (Jun., 1994).

Diaz et at., *High-Power InGaAsP/GaAs 0.8 Laser Diodes and Peculiarities of Operational Characteristics*, Appl. Phys. Lett. 65 (8), pp.1004–1005 (Aug. 22, 1994).

Hoff et al., *Intersubband Hold Absorption in GaAs-GainP Quantum Wells Grown by Gas Source Molecular Beam Epitaxy*, Appl. Phys. Lett 65(9), pp. 1130–1132 (Aug. 29, 1994).

Kiernan, *ARPA Seeks Cheaper, Better Laser Weapons*, Laser Focus World, p. 53 (Jul., 1994).

Mitchel et al., *Interface Roughness Scattering in Thin, Undoped GainP/GaAs Quantum Wells*, Appl. Phys. Lett. 65 (12), pp. 1578–1580, (Sep. 19, 1994).

Besikei & Razeghi, *On the Description of the Collision Terms in Three-Valley Hydrodynamic Models for GaAs Device Modeling*, IEEE Transactions on Electron Devices, vol. 42, No. 8, pp. 1471–1475 (Aug. 8, 1994).

Jungbluth, *Aluminum-Free High-Power Diodes Have Long Lifetimes*, Laser Focus World, pp. 26–27 (Aug. 26, 1994).

Diaz et al., *Theoretical Investigation of Minority Carrier Leakages of High-Power 0.8 um InGaAsP/InGaP/GaAs Laser Diodes*, Appl. Phys. Lett. 65(18), pp. 2260–2262 (Oct. 31, 1994).

*InGaAsP Laser Diodes Outperform AlGaAs*, Opto & Laser Europe, Issue 14, pp. 37–38 (Oct., 1994).

Michel et al., *Molecular Beam Epitaxial Growth of High Quality InSb*, Appl. Phys. Lett. 65(26), pp. 3338–3340 (Dec. 26, 1994).

Elhamri et al., *Persistent Photoconductivity in Thin Undoped GainP/GaAs Quantum Wells*, Appl. Phys. Lett. 66(2), pp. 171–173 (Jan. 16, 1995).

Dobbelaere et al., *Growth and Optical Characterization of InAs$^{1-x}$Sb$^x$ on GaAs and on GaAs-Coated Si By Molecular Beam Epitaxy*, Appl. Phys. Left. 55, pp. 1856–1858 (1989).

Razeghi, *High-Power Laser Diodes Based on InGaAsP Alloys*, Nature, vol. 369, pp. 631–633 (Jun. 23, 1994).

Diaz et al., *InGaP/InGaAsP/GaAs 0.808um Separate Confinement Laser Diodes Grown by Metalorganic Chemical Vapor Deposition*, IEEE Photonics Technology Letters, vol. 6, No. 2, pp. 132–134 (Feb., 1994).

Bezinski & Razeghi, *Electron Transport Properties of Ga$_{0.51}$In$_{0.49}$P for Device Applications*, IEEE Transactions on Electron Devices, vol. 41, No. 6, pp. 1066–1069 (Jun., 1994).

Diaz et al., *High-Power InGaP/InGaAsP/GaAs 0.8 um Laser Diodes and Peculiarities of Operational Characteristics*, Appl. Phys. Lett. 65(8), pp. 1004–1005 (Aug. 22, 1994).

Brown & Hegde, *Intersubband Hole Absorption in GaAs--GaInP Quantum Wells Grown By Gas Source Molecular Beam Epitaxy*, Appl. Phys. Lett. 65(9), pp. 1130–1132 (Aug. 29, 1994).

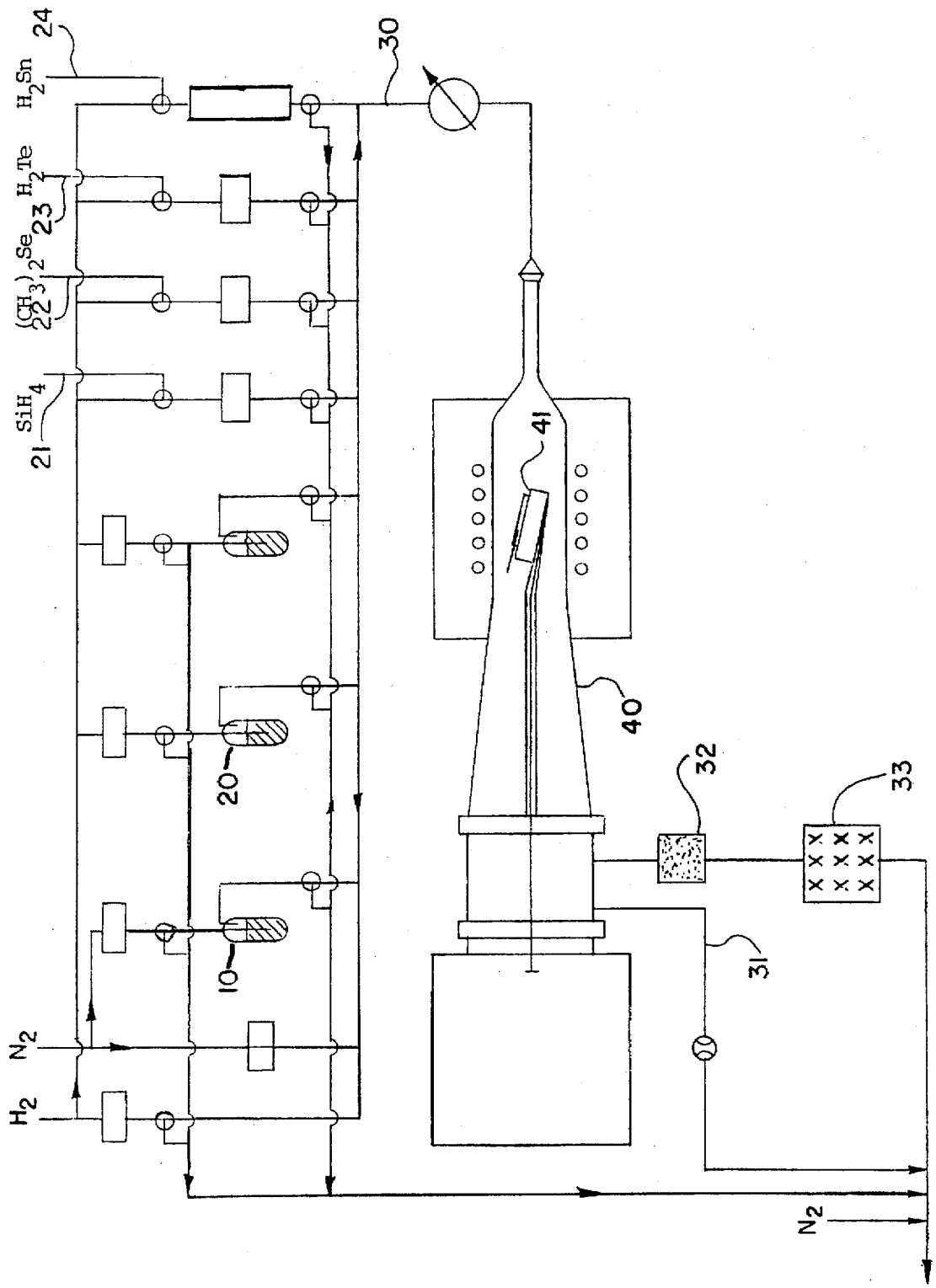

COMPOSITION FOR INSB AND GAAS THIN FILM ON SILICON SUBSTRATE FOR USE IN PHOTODETECTORS

This application is a continuation, of application Ser. No. 08/344,340 filed Nov. 22, 1994, now abandoned.

TECHNICAL FIELD

The U.S. Government has rights in this invention pursuant to ONR Contract Number N00014-93-0931.

This invention relates to an InSb thin film grown by Molecular Beam Epitaxy (MBE) or Metallorganic Chemical Vapor Deposition (MOCVD) and a method of manufacturing the film, and more particularly to the III-V group intermetallic compound InSb or GaAs thin film on a silicon substrate for use in photodetectors and lasers.

At present, there are, in general, three material systems which are most used for long wavelength infrared detector (LWIR) applications. HgCdTe is the most common material used in intrinsic LWIR detector applications. However, there are many material problems which limit this material as an IR detector. The weak Hg-Te bonding restricts the strength of the material and causes problems in material processing. The high vapor pressure of Hg leads to difficulty in growing a highly uniform composition over a large area. The self compensation mechanism of HgTe makes high levels of doping difficult. This high Hg diffusion coefficient decreases the stability of the devices. HgCdTe is difficult to grow on Si and GaAs, two of the more common substrates, which makes it a less ideal material for Focal Plane Arrays application.

Ge:Hg is another material for extrinsic LWIR application. This material system has two major of the more common substrates, which makes it a less ideal material for Focal Plane Arrays application.

Ge:Hg is another material for extrinsic LWIR application. This material system has two major problems—it requires low temperature operation (30K) and the indirect band gap of Ge restricts the speed of response.

A GaAs/AlGaAs quantum well infrared detector has recently been realized by using the transitions between the subbands in the GaAs well. The best result obtained in this structure is the detection on $10^{10}$ cm $Hz^{1/2}W^{-1}$ at an operating temperature of 68K in a detector with a cut-off wavelength of 10.7 µm. Although these structures show some promise, they are currently expensive to produce and are unstable against interdiffusion at higher temperatures.

Another material system which has recently been investigated extensively for infrared detector application is InSb. The bandgap of this material is 0.17 eV at 300K. In order to have material in the long wavelength region, InTlSb has been considered. Nonequilibrium growth techniques such as MBE and MOCVD can overcome the phase segregation problem.

Metallorganic chemical vapor deposition (MOCVD) has established itself as a unique and important epitaxial crystal growth technique yielding high-quality low-dimensional structures for semiconductor devices, both electronic and photonic. The growth of semiconductor III-V compounds by MOCVD involves introducing metered amounts of the group III alkyls and the group V hydrides into a quartz tube that contains a substrate placed on radiofrequency heated carbon susceptor. The hot susceptor has a catalytic effect on the decomposition of the gaseous products and the growth therefore takes place primarily at this hot substrate. MOCVD is attractive because of its relative simplicity compared to other growth methods.

The technique is attractive in its ability to grow uniform layers, its low background doping density and sharp interfaces, and in the potential for commercial applications.

The molecular beam epitaxy (MBE) process involves the reaction of one or more thermal beams of atoms and molecules of the III-V elements with a crystalline substrate surface held at a suitable temperature under ultra-high-vacuum (UHV) conditions.

Since MBE is essentially a UFO evaporation technique, the growth process can be controlled in situ by the use of equipment such as pressure gauge, mass spectrometer and electron diffraction facility located inside the MBE reactor. The MBE growth chamber can contain other components for surface analytical techniques, including reflection high-energy electron diffraction (RHEED), Auger electron spectroscopy (AES) (another non-destructive analytical method for characterization of the initial substrate surface, verification of surface accumulation of dopant elements during epitaxial growth, and determination of the change in the relative ratio of the constituent elements of reconstructed surface structures), X-ray photoelectron spectroscopy (XPS), low-energy electron diffraction (LEED), electron spectroscopy for chemical analysis (ESCA), secondary-ion mass spectroscopy (SIMS) (a powerful tool for surface and bulk material-composition analysis for pre- and post-deposition analysis during MBE growth) and ellipsometry, which can all be used as in situ surface diagnostic techniques during MBE growth, due to the UV growth conditions.

MBE has attracted much interest as an excellent crystal growth technology, especially for GaAs-based multilayer structures, because of its extremely precise control over layer thickness and doping profile, and the high uniformity of the epitaxial layer over a large area of a substrate (>3 inch diameter).

The disadvantages of MBE are that it is expensive, and that difficulties have been reported with p-type doping by Zn.

Recently, high-quality InSb films have been grown on GaAs and GaAs-coated Si substrates by MOCVD and MBE. Such structure allows for monolithic integration of large detector arrays with the readout circuitry. A 4.8 µm-thick InSb layer grown on GaAs by MBE had a X-ray rocking curve full-width-at-half-maximum (FWHM) of 158 arcsec and a Hall mobility of 92300 $cm^2V^{-1}S^{-1}$ at 77K. InSb films grown by MOCVD also exhibited equally impressive material quality: a 3.3 µm-thick InSb film grown on GaAs had a X-ray FWHM of 171 arcsec and a Hall mobility of 66000 cm2V-1s-1 at 77K, while a 6.3 µm-thick InSb film grown on GaAs-coated Si exhibited a X-ray FWHM of 128 arcsec. All the layers were nucleated directly onto the substrates without the need for an intermediate AlSb layer or low temperature Atomic Layer Epitaxy to improve the quality of the interface. The temperature dependence of the Hall mobility between 4K to 300K was found to follow that expected for bulk n-type InSb. These are very encouraging results but large density of dislocation still exists due to the large lattice-mismatch between InSb and these substrates. These dislocations can serve as gettering sources of impurities as well as lead to high leakage current that are detrimental to detector performance.

SUMMARY OF THE INVENTION

Therefore, an object of the subject invention is a semi-metallic III-V alloy of the formula InSb on a silicon substrate for use in a film for long wavelength infrared detector and laser applications and a method for making such a film.

A further object of the subject invention is a method for making a III-V alloy of the formula InSb on a silicon substrate through the use of a MBE or MOCVD process.

A further object of the subject invention is a hetero and other multiple layer films with a layer of undoped InSb adjacent a layer of doped InSb or GaAs over a silicon substrate.

The above objects are attained by growing an InSb or GaAs film by a gaseous epitaxy method such as MOCVD, MBE or other known method on a silicon substrate. Triethylindium and trimethylantimony may be used as sources for In and Sb, respectively, while Triethylgallium and $AsH_3$ may be sources for Ga and As. Growth conditions such as substrate temperature, flow rates, and orientation of the substrates are monitored to obtain high quality films of approximately 0.5 to 2.0 μm which are then doped. An active, undoped layer of InSb or GaAs is next, followed by a doped layer of InSb or GaAs as a cap layer. This film may be used in photodetectors with little or no "dark current".

These and other objects and features of the invention will be better appreciated by reference to the following description of the various embodiments made in conjunction with the accompanying drawings wherein, The figure is a schematic showing an MOCVD reactor for use in the subject invention.

DETAILED DESCRIPTION OF THE INVENTION

When growing InSb or GaAs by MOCVD or MBE, all ingredients and operating conditions are maintained very clean and purity is absolutely necessary. Superclean semi-insulating silicon is used as a substrate. As a first step when preparing an InSb photodetector, an InSb layer is grown on the substrate.

Referring to FIG. 1, pure $H_2$ (99.9999%) is bubbled through solution 10 containing the precursor Indium source, such as trimethyl indium or triethyl indium which is maintained at 0°–18° C., preferably 18° C. at 1.5 l/min. The $H_2$ gas flow containing the dilute vapor solution of the indium precursor is transported at or near room temperature to the hot substrate 41. $H_2$ is also bubbled through the Sb source 20, i.e., a liquid solution of the precursor trimethylantimony or triethylantimony. The dilute vapor solution of the antimony precursor is transported through line 30 to the substrate chamber 40 where substrate 41 is mounted. Substrate 41 is silicon, as stated above. The temperature of substrate 41 may be kept from 400° C. to 500° C., and preferably at 480° C. for purposes of this invention. The pressure throughout the growth procedure of the substrate chamber is maintained at low pressures of 50–100 torr, preferably at 76 torr. Unreacted gas and vapor are exhausted through line 31, or through filter 32 to molecular sieve trap 33 to exhaust. The In and Sb precursor vapors are transported to the substrate for a given period of time to achieve a desired thickness, which may range from 10 A° to the desired thickness of 0.5–2 μm, or higher. Generally, maintenance of the flow of the precursors for ½ hour is sufficient to reach the desired thickness of 0.5 μm.

After the first layer of InSb is grown, the layer is doped through inlets 21–24 which are used to permit the entry of gases such as disilane, $H_2S$, dimethyl selenium, ($H_2Te$) or ($H_2Sn$), for n-type doping. Pure $H_2$ or $N_2$ may be used as a carrier gas. Doping is continued until the concentration of dopant reaches from $10^{16}$ to $5 \times 10^{17}$. The cap layer may be doped with Be, Mg, Mn or Cd as known in the art.

A similar procedure is utilized when preparing a GaAs photodetector.

EXAMPLE 1

Using the reactor of FIG. 1, InSb is deposited on a substrate of Si by bubbling pure $H_2$ through liquid solutions of the precursors triethylindium and tetraethylantimony at a flow rate of 1.5 l/min each for 1 hour. Both precursor solutions are maintained at 18° C. The $H_2$ carries the precursor vapors to the substrate which is maintained at 480° C. InSb is thus grown on the substrate to a thickness of 1 μm. Silane is then flowed over the InSb layer at a rate of 100 cc/min at a concentration of 100 ppm in $H_2$ to achieve a concentration at the surface of the InSb layer of $10^{16}$ atoms $cm^{-3}$.

After doping, a 2nd layer of InSb is grown in a manner similar to the first, this time maintaining the flow of precursor vapors and temperature for approximately 5 hours, thereby reaching a thickness of 5 μm. This layer is left undoped. A third layer of InSb is similarly grown to a thickness of 0.5 μm and doped by flowing dimethyl zinc onto the structure at 480° C. for 2 hours to reach a concentration of Zn of $10^{19}$ $cm^{-3}$ at the surface.

The resulting InSb multilayer structure is detector grade with uniform qualities. Very few, if any, crystal defects are observed.

EXAMPLE 2

Using the reactor of FIG. 1 GaAs is deposited on a substrate of Si by bubbling pure $H_2$ through liquid solutions of the precursors triethylgallium and Arsine at a flow rate of 1.5 l/min. each for one hour. Both precursor solutions are maintained at 18° C. The $H_2$ carries the precursor vapors to the substrate which is maintained at 480° C. GaAs is thus grown on the substrate to a thickness of 1 μm. Silane is then flowed over the GaAs layer at a rate of 100 cc/min. at a concentration of 100 ppm in $H_2$ to achieve a concentration at the surface of the GaAs layer of $10^{16}$ atoms $cm^{-3}$.

EXAMPLE 3

The procedure set forth in Example 1 is followed with the exception of the doping procedure. Here, doping of the final InSb layer was carried out at 100 cc/min at a concentration of 100 ppm silane in $H_2$ for a period of one hour. As a result, the concentration of dopant is $10^{16}$ $ccm^{-3}$ at the surface. The quality of the structure is good and the observable dark current is low.

EXAMPLE 4

The procedure set forth in Example 1 is followed with the exception of the doping procedure. Here, doping of the final InSb layer was carried out at 125 cc/min at a concentration of 100 ppm silane in $H_2$ for a period of one hour. As a result, the concentration of Si at the surface is $10^{17}$ $cm^{-3}$. The quality of the structure is good and the observable dark current is low.

EXAMPLE 5

An InSb PIN photodetector on Si was prepared from the layered structures of Ex. 1 in a manner well known in the art. A pn junction was formed by Zn diffusion using the semi-closed box technique, which was located through the window in the cap layer (doped InSb) to the undoped InSb layer, using a SiO$_2$ mask. The ohmic contacts are made by sputtered Au—Zn alloyed at 450° C. for 30 seconds and then covered with Cr—Au on the p side, and by sputtered Au on the n side (Si substrate).

EXAMPLE 6

Using the MBE growth technique, with conventional Knudsen solid sources used as precursors for group III and V elements as well as for dopants, a PIN photo detector film grown on Silicon substrate was realized. In the Sb solid sources were maintained at temperatures which provide a growth rate of 1 µm.h$^{-1}$ and low V/III ratio.

A first layer of InSb is deposited at a growth temperature of 480° C. and doped with Si using the doping procedure of Example 1. Following this first layer, a second intrinsic layer of 5 µm thick is grown. To achieve a high quality in the InSb layer required a well balanced flux ratio due to the very narrow stoichiometric growth of InSb. Because of a necessarily long growth period of 5 hours, an accurate control of the molecular beam flux ratio is necessary. Such control is realized by using an in-situ probe as RHEED, which, by providing surface reconstruction patterns, indicates the structural change of the relative incorporation rate.

The effusion rate, and therefore the incorporation, of the different species are controlled by the temperature of the cells and can be readjusted in real time. The temperature of the growth is also accurately controlled during the entire growth period.

Finally, a third layer of 0.5 µm thick of InSb p-type doped, using a solid source of Be, is grown.

The resulting InSb multilayer structure is detector grade with uniform qualities. Very few, if any, crystal defects are observed.

The growth of an n-doped (~1×10$^{16}$ cm$^{-3}$) InSb layer prior to an undoped InSb layer has been found to overcome the problem of "dark current" and eventually realize the goal of a high-performance detector. In the operation of photovoltaic detectors, the signal is generated in the depletion region created near the p+-i (intrinsic) interface. In the absence of a n-doped layer, the depletion region in the undoped i-layer can reach the highly dislocated layer at the interface between InSb and the substrate and create noise or dark current. However, by growing a 1-2 µm thick n-doped InSb layer, the depletion region can be confined near the i-n interface of InSb (undoped) / InSb (n-doped) buffer layer, where the density of the dislocation is much less than InSb/GaAs interfaces. Using this InSb (n-doped) buffer layer, the dark-current of photodetector can be decreased, and the sensitivity and performance of the device increased.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents falling within the scope of the appended claims.

Various features of the invention are set forth in the following claims.

What is claimed:

1. A composite film for use in photodetectors, said film comprising sequential layers of InSb, said sequential layers being a first doped InSb layer adjacent and abutting a silicon substrate, an undoped InSb layer adjacent and abutting said first doped InSb layer and a second doped InSb layer adjacent and abutting said undoped InSb layer.

2. The composite film of claim 1 wherein said first doped layer is doped with a n-type dopant selected from the group consisting of S, Si, Sn, Te and Se.

3. The composite film of claim 1 wherein said first doped InSb layer is from about 0.5 µm to about 2 µm thick.

4. The composite film of claim 1 wherein said undoped layer is 3-5 µm thick.

5. The composite film of claim 1 wherein said second doped layer is doped with a p-type dopant selected from the group consisting of Be, Mg, Mn and Cd.

6. A composite film for use in photodetectors, said film comprising sequential layers of InSb, said sequential layers being a first doped InSb layer adjacent and abutting a silicon substrate with no intermediate material between said first InSb layer and said substrate, an undoped InSb layer adjacent and abutting said first doped InSb layer and a second doped InSb layer adjacent and abutting said undoped InSb layer.

* * * * *